(12) United States Patent
Lee et al.

(10) Patent No.: US 7,110,170 B2
(45) Date of Patent: Sep. 19, 2006

(54) SEMICONDUCTOR OPTICAL AMPLIFIER HAVING PHOTO DETECTOR AND METHOD OF FABRICATING THE SAME

(75) Inventors: Jeong-Seok Lee, Anyang-si (KR); Yun-Je Oh, Yongin-si (KR); Seong-Taek Hwang, Pyeongtaek-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 191 days.

(21) Appl. No.: 10/780,306

(22) Filed: Feb. 17, 2004

(65) Prior Publication Data

US 2005/0041280 A1 Feb. 24, 2005

(30) Foreign Application Priority Data

Aug. 20, 2003 (KR) .................... 10-2003-0057706

(51) Int. Cl.
*H01S 3/00* (2006.01)
(52) U.S. Cl. ...................................... 359/344
(58) Field of Classification Search ............... 359/344
See application file for complete search history.

(56) References Cited

U.S. PATENT DOCUMENTS

| | | | | |
|---|---|---|---|---|
| 4,162,460 A | * | 7/1979 | Gonda ...................... 372/50.11 |
| 5,134,671 A | * | 7/1992 | Koren et al. ................... 385/14 |
| 5,309,469 A | * | 5/1994 | Koren et al. ............. 372/50.22 |
| 5,414,554 A | * | 5/1995 | Aoyama ...................... 359/344 |
| 5,796,768 A | * | 8/1998 | Mersali et al. ........... 372/45.01 |
| 6,556,344 B1 | * | 4/2003 | Koren ...................... 359/341.4 |
| 6,819,814 B1 | * | 11/2004 | Forrest et al. ................. 385/14 |
| 6,836,357 B1 | * | 12/2004 | Wang et al. ................. 359/344 |
| 2003/0072076 A1 | * | 4/2003 | Yoon et al. .................. 359/344 |
| 2003/0112500 A1 | * | 6/2003 | Miki et al. ................... 359/344 |

FOREIGN PATENT DOCUMENTS

| | | |
|---|---|---|
| JP | 62-278507 | 12/1987 |
| JP | 63-157108 | 6/1988 |
| JP | 63-296006 | 12/1988 |
| JP | 04285919 A * | 10/1992 |
| JP | 06-130238 | 5/1994 |

* cited by examiner

*Primary Examiner*—Deandra M. Hughes
(74) *Attorney, Agent, or Firm*—Cha & Reiter, L.L.C.

(57) ABSTRACT

A gain-clamped semiconductor optical amplifier having photo detectors which are integrated on a single crystal substrate can detect optical intensities at input/output terminals of the optical amplifier. The semiconductor optical amplifier includes a first conductive semiconductor substrate, a semiconductor optical amplifier formed on the semiconductor substrate so as to have a horizontal-direction lasing structure, and a first and a second photo detector formed respectively at positions of the semiconductor substrate spaced horizontally from an input side and an output side of the semiconductor optical amplifier so as to measure intensities of an input signal and an output signal of the semiconductor optical amplifier.

22 Claims, 13 Drawing Sheets

SEMICONDUCTOR OPTICAL AMPLIFIER HAVING PHOTO DETECTOR AND METHOD OF FABRICATING THE SAME

CLAIM OF PRIORITY

This application claims priority to an application entitled "Semiconductor optical amplifier having photo detector and method of fabricating the same," filed in the Korean Intellectual Property Office on Aug. 20, 2003 and assigned Serial No. 2003-57706, the contents of which are hereby incorporated by reference.

BACKGROUND OF THE INVENTION

1. Field of the Invention

The present invention relates to an optical amplifier, and more particularly to a gain-clamped semiconductor optical amplifier having photo detectors which are integrated on a single crystal substrate and can detect optical intensities at input/output terminals of the optical amplifier, and a method of fabricating the gain-clamped semiconductor optical amplifier.

2. Description of the Related Art

In a general optical communication system, light emitted from a transmitter that is transmitted through an optical transmission line suffers transmission loss that reduces the signal arriving at a receiver. When the power of light arriving at a receiver is smaller than a predetermined value, the receiving error prevents normal optical communication from being performed. Therefore, an optical amplifier is provided between a transmitter and a receiver so as to amplify light, thereby compensating for the transmission loss of the light transmitted through the optical transmission line and enabling the light to be transmitted to a farther distance with little error.

Such optical amplifiers include an erbium-doped fiber amplifier (hereinafter, referred to as EDFA), a Raman amplifier, and a semiconductor optical amplifier (hereinafter, referred to as SOA).

The EDFA, which uses an optical fiber doped with the rare-earth elements, e.g., erbium, for amplification, has a high gain characteristic, a low noise figure (NF), and high saturation output power. EDFA has accordingly been widely used in a backbone network or in a metro network. However, the EDFA is expensive and affords an operation wavelength that is limited to a 1.5 μm band.

The Raman amplifier uses a Raman amplification in an optical fiber. Raman amplification is a method for amplifying light using a so-called Raman amplification phenomenon. According to Raman amplification, when a pumping light of a strong light is incident into the optical fiber, a gain appears at a longer wavelength side distanced about 100 nanometers (nm) from the wavelength of the pumping light due to stimulated Raman scattering. Light of the wavelength band having the above-described gain is incident into the excited optical fiber, so that light is amplified. The Raman amplifier can easily adjust an amplification band by properly setting the wavelength of the pumping light for the Raman amplification, and has a low noise figure. However, the Raman amplifier not only has very low optical amplification efficiency but also needs a high-priced pumping light source, thereby increasing the entire size of the optical amplifier module and the price of the optical amplifier module.

The SOA uses gain characteristics of a semiconductor and can adjust its amplification band according to a semiconductor band gap. The SOA advantageously features a small size of a few centimeters (cm) and, notably, does not require a high-priced pumping light source.

However, the SOA generally suffers a gain saturation phenomenon in which the gain value decreases with increase in the intensity of the input signal. Amplification for transit of a signal having large optical power therefore causes signal distortion.

In order to solve this problem, a gain-clamped SOA having a structure as shown in FIG. 1 has been proposed.

FIG. 1 is a view showing a structure of a conventional gain-clamped semiconductor optical amplifier (gain-clamped SOA) 100. The gain-clamped SOA 100 includes an n-InP substrate 101, an InGaAsP passive waveguide layer 102, an InP spacer 103, a DBR lattice pattern 104, an active-layer waveguide 105, a current blocking layer 106, a p-InP clad layer 107, a p-InGaAs layer 108 for reducing an ohmic contact resistance, an oxide layer 109, an upper electrode 110, and a lower electrode 111.

The gain-clamped SOA 100 induces laser oscillation in a short wavelength, far from a wavelength range of an input signal to be amplified, by using both distributed Bragg reflector lattices, thereby fixing the density of carriers in a resonator, so that optical gain is constantly maintained even though a driving current increases.

However, in the conventional gain-clamped SOA, a first procession direction (shown as "A" in FIG. 1) of a signal is the same as a second procession direction (shown as "B" in FIG. 1) of a laser beam to induce oscillation. Therefore, when signals of several channels are amplified, a four wave mixing phenomenon is caused between an oscillation wavelength and a signal wavelength. Further, the conventional gain-clamped SOA has another problem in that a separate wavelength filter is required for removing the oscillation wavelength of the laser.

Meanwhile, in order to control a gain of the gain-clamped SOA or check whether or not a device is properly operated, it is necessary to know intensities of an inputted signal and an amplified/outputted signal. To this end, conventionally, after a portion of optical power of the signal inputted to the amplifier and a portion of optical power the signal outputted from the amplifier are separated by means of optical dividers, each portion is inputted to a photo detector to be measured.

However, according to the conventional art, since a portion of a signal is separated, optical power is lost, thus degrading important properties of the optical amplifier, such as noise, saturation optical output, gain, etc. Also, since at least one optical divider and at least one photo detector are additionally required to detect a portion of an optical signal, the number of components and processes increases, making a competitive price for the product more difficult to realize.

SUMMARY OF THE INVENTION

The present invention has been made to solve the above-mentioned problems occurring in the prior art, and an object of the present invention is to provide a semiconductor optical amplifier having photo detectors that can detect signal intensities at input/output terminals of the optical amplifier without using a separate optical divider.

Another object of the present invention is to provide a semiconductor optical amplifier having photo detectors and a method of fabricating the semiconductor optical amplifier, in which the photo detectors capable of detecting signal intensities at input/output terminals of the optical amplifier are integrated onto a single crystal substrate.

In order to accomplish these objects, there is provided a semiconductor optical amplifier comprising of: a first conductive semiconductor substrate; a semiconductor optical amplifier formed on the semiconductor substrate so as to have a horizontal-direction lasing structure; and a first and a second photo detector formed respectively at positions of the semiconductor substrate spaced horizontally from an input side and an output side of the semiconductor optical amplifier so as to measure intensities of an input signal and an output signal of the semiconductor optical amplifier.

It is preferred that the first and the second photo detectors include a material the same as that of the gain layer of the semiconductor optical amplifier.

In accordance with another aspect of the present invention, there is provided a method of fabricating a semiconductor optical amplifier having a photo detector, the method comprising the steps of: (a) forming a Bragg lattice on a portion of a first conductive semiconductor substrate except for a predetermined gain layer area and a predetermined photo detector area; (b) forming a first conductive lower clad layer, an optical waveguide layer, a first conductive upper clad layer, again material layer, and a second conductive clad layer on the first conductive semiconductor substrate on which the Bragg lattice is formed; (c) forming mask patterns on portions of the second conductive clad layer which corresponds to the predetermined gain layer area and each area spaced horizontally by a predetermined distance respectively from a front end and a rear end of the predetermined gain layer area; (d) selectively etching the second conductive clad layer and the gain material layer through an etching process using the mask patterns as an etching mask, and then removing the mask patterns; (e) forming a current blocking layer for preventing current from flowing to any area except the gain layer and photo detector area; and (f) forming an electrode for supplying current to the gain layer and the photo detector area.

BRIEF DESCRIPTION OF THE DRAWINGS

The above and other objects, features and advantages of the present invention will be more apparent from the following detailed description taken in conjunction with the accompanying drawings, in which the same or similar elements are annotated identically throughout the several views.

DETAILED DESCRIPTION OF THE PREFERRED EMBODIMENT

A semiconductor optical amplifier having photo detectors and a method of fabricating the same according to preferred embodiments of the present invention are described below with reference to the accompanying drawings. In the following description of the present invention, detailed description of known functions and configurations incorporated herein is omitted for clarity of presentation.

Figure 1:
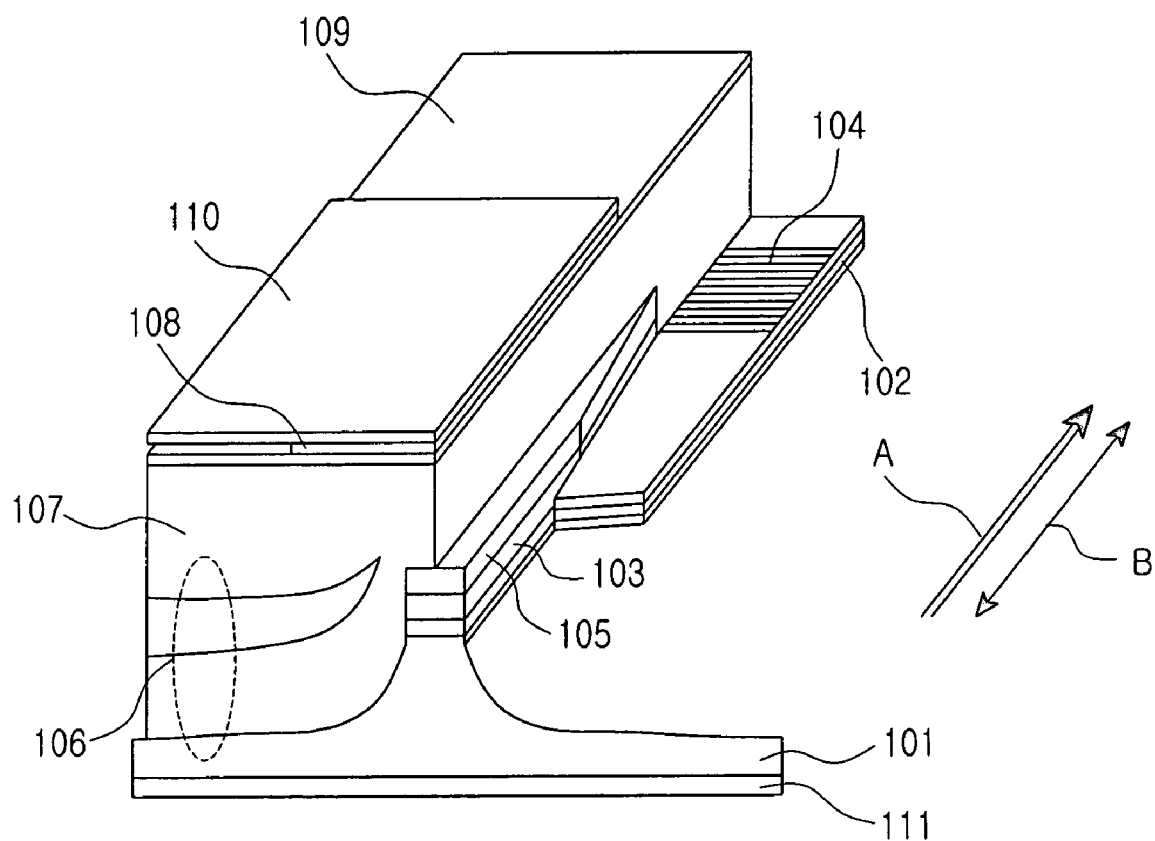
FIG. 1 is a schematic view showing a structure of the conventional gain-clamped SOA.
Figure 2:
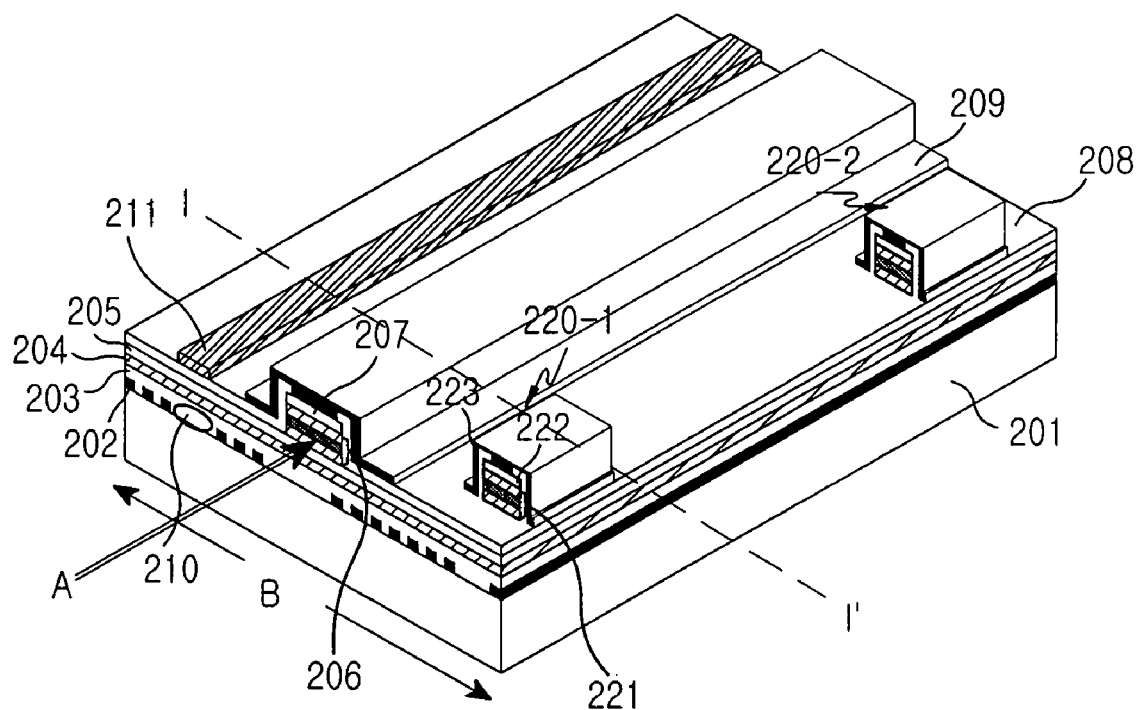
FIG. 2 is a view showing a construction of a SOA having photo detectors according to one embodiment of the present invention.
Figure 3:
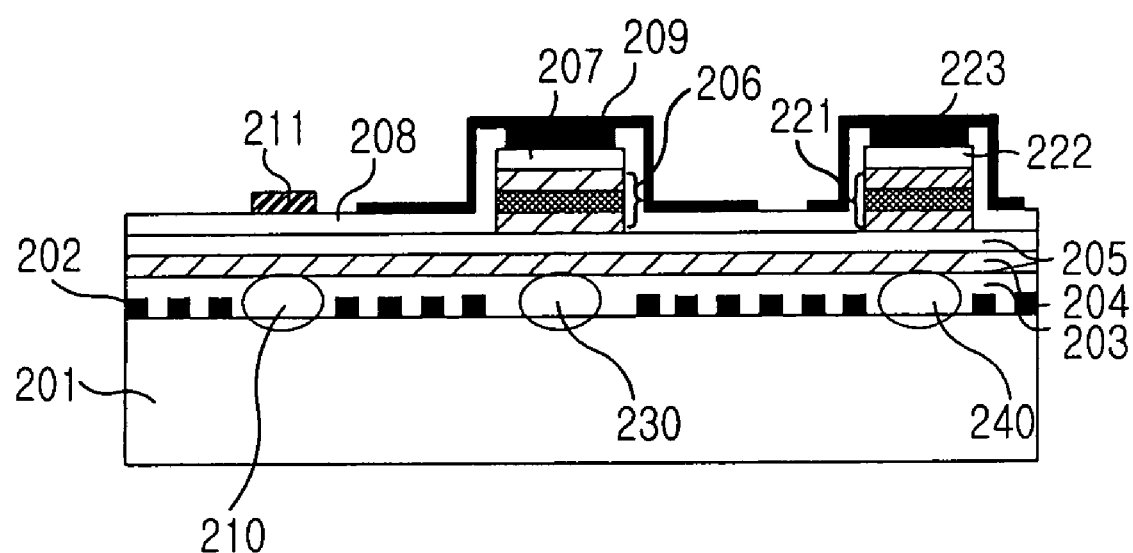
FIG. 3 is a cross-sectional view taken along line I–I' in FIG. 2.

FIG. 2 is a view showing, by way of illustrative and non-limitative example, a construction of a ridge waveguide-type gain-clamped SOA 200 having photo detectors according to one embodiment of the present invention, and FIG. 3 is a cross-sectional view taken along line I–I' in FIG. 2.

The SOA 200 having photo detectors includes a semiconductor substrate 201, a Bragg lattice layer 202, an n-InP lower clad layer 203, a passive optical waveguide layer 204, an n-InP upper clad layer 205, a gain layer 206, a p-InP clad layer 207, an electrode 209, a current blocking layer 208, and photo detectors 220-1 and 220-2. In addition, the SOA 200 includes a phase conversion area 210 and a phase conversion electrode 211.

The Bragg lattice layer 202 is formed above or below the passive optical waveguide layer 204 in order to enable light having a corresponding wavelength to resonate between the Bragg lattices of the Bragg lattice layer 202, so that Bragg laser is oscillated in a horizontal direction. The drawings representing the present embodiment show a case in which the Bragg lattice layer 202 is formed below the passive optical waveguide layer 204.

In order to restrict optical loss of modes which is resonated by Bragg lattices formed on both sides of the Bragg lattice layer 202 and to efficiently perform Bragg reflection, the passive optical waveguide layer 204 provides a high optical confinement coefficient between the Bragg lattice layer 202 and the gain layer 206 and has a refractive index greater than that of the semiconductor substrate 201.

The gain layer 206 amplifies an input optical signal and is formed on a portion of the n-InP upper clad layer 205 below which the Bragg lattice 202 is not formed. The p-InP clad layer 207 is formed on the gain layer 206.

The current blocking layer 208 prevents current from flowing to any area except the gain layer 206, thereby increasing the current efficiency of the gain layer 206. Such a current blocking layer 208 is formed on a portion of the n-InP upper clad layer 205 except for a peripheral area of the gain layer 206 and a photo detector area 220.

The electrode 209 supplies current into the gain layer 206 and is formed on a wide area of the n-InP upper clad layer 205 so that conductive wires can be easily connected when a module is manufactured.

The phase conversion area 210 controls a critical current of a laser by controlling a lasing wavelength, thereby controlling a gain value of a gain-clamped SOA. The phase conversion area 210 can be achieved by omitting Bragg lattice from a portion of the Bragg lattice layer 202.

The phase conversion electrode 211 can change the oscillation wavelength of the laser by changing current or voltage applied into the phase conversion area 210. The phase conversion electrode 211 is formed on the current blocking layer 208 or the n-InP upper clad layer 205. When the oscillation wavelength of the laser is changed, a driving current required for oscillation is changed because a gain curve of a gain region is formed differently depending on wavelengths. As a result, the gain value of the amplifier is changed in a wavelength region for amplification.

The photo detectors 220-1, 220-2 measure output values of a gain-clamped lasing wavelength which are changed depending on intensities of an input signal and an output signal of the SOA, respectively. The photo detectors 220-1, 220-2 are formed horizontally spaced from an input side and an output side of the SOA. The photo detectors 220-1, 220-2 include a material the same as that of the gain layer 206 of the SOA. The photo detectors 220-1, 220-2 can be integrated onto the single crystal semiconductor substrate together with the SOA without a separate photo detector growing process, by leaving predetermined portions of a gain material at positions horizontally spaced from the gain layer 206 when performing an etching process for forming the gain layer. A p-InP clad layer 222 and an electrode 223 are formed on an active layer 221 of each photo detector 220-1, 220-2 in a manner analogous to that for the gain layer 206.

Operationally and referring to FIGS. 2 and 3, when a pumping current is injected into the gain layer 206, spontaneous emission causing transition from a first conduction band of a higher energy level to a second conduction band of a lower energy level are created, so that stimulated emission occurs due to transition to a valence band of a lower energy level. Part of the light generated by the spontaneous emission from the gain layer 206 is restrained in the passive optical waveguide layer 204. A specific wavelength of the restrained light satisfying a resonance condition of the Bragg lattice is repeatedly fed back through a resonance interval formed between the passive optical waveguide layer 204 and the gain layer 206 and both sides of the gain layer 206. When feedback occurs once, light having the specific wavelength passes the gain layer 206 two times to obtain again by stimulated emission which is generated due to density inversion. When the gain of the gain layer 206 increases according to the increase of current until the gain is greater than optical loss generated during one feedback in the horizontal direction, oscillation is generated. When such oscillation begins, charge density of the gain layer is fixed, so that a gain of the gain layer exhibits, as a gain-clamping characteristic, that the gain of a device is not increased despite an increase in driving current. When the driving current is continuously increased over an oscillating current, the gain is not increased; instead, only optical intensity of an oscillating wavelength is continuously increased. At this time, light is amplified in a length direction (shown as "A" in FIG. 2) of the gain layer 206, and the oscillation of a laser occurs in a horizontal direction (shown as "B" in FIG. 2).

Meanwhile, when the intensity of a signal injected into the SOA increases, the intensity of an amplified signal increases due to a linear gain characteristic. At this time, the oscillation output of the Bragg lattice laser used for gain clamping relatively decreases. In the case of a gain-clamped SOA using a laser oscillation characteristic having a short wavelength instead of amplification wavelength so as to clamp the gain, when a signal to be amplified passes through the amplifier, a corresponding wavelength portion of charge in the amplifier is consumed. The decrease in charge density reduces the output of an oscillation laser wavelength. Also, the amount of charge consumed by the signal increases with the increase in signal intensity, so that the intensity of the oscillation wavelength is reduced. At this time, the intensity of the signal can be found through measurement of the intensity of the oscillation wavelength based on a relationship between the intensity of the oscillation wavelength, as measured in the horizontal direction, and the intensity of the signal passing through the amplifier.

Since the intensity of the oscillation wavelength decreases by the amount of energy which an input signal requires for its amplification while passing through the amplifier, the voltage intensity detected by the photo detectors at an input terminal and an output terminal of the SOA is inversely proportional to intensity of a signal passing the amplifier. Accordingly, using this characteristic, it is possible to know the intensity of a signal inputted into an amplifier device and the intensity of a signal amplified by the amplifier device.

FIGS. 4A to 4G are views for explaining an exemplary fabricating process of the ridge waveguide-type gain-clamped SOA having photo detectors shown in FIG. 2.

Figure 4A:
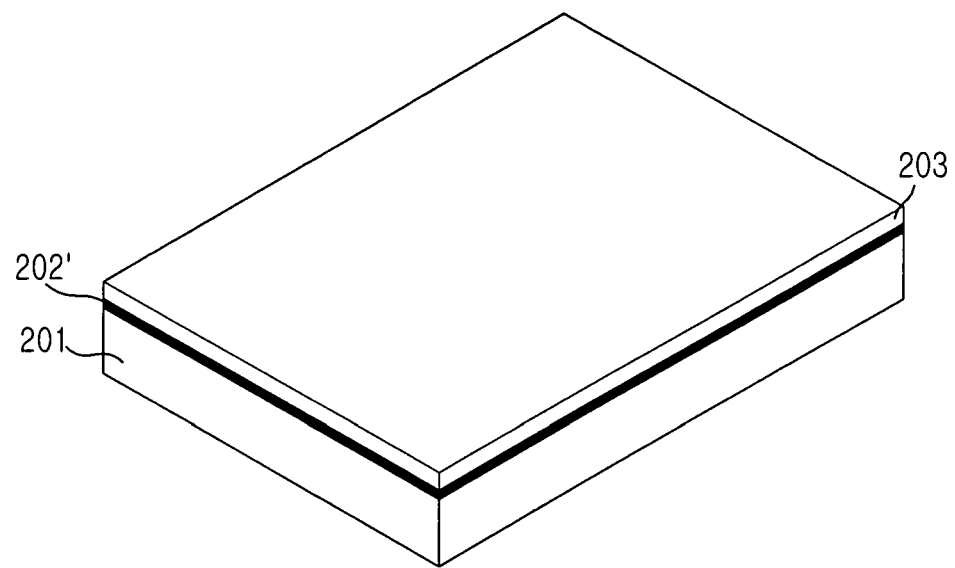
FIGS. 4A to 4G are views for explaining a fabricating process of the SOA having photo detectors shown in FIG. 2.

First, as shown in FIG. 4A, a material layer 202' having a different refractive index from the n-InP substrate 201 and the n-InP layer 203 is formed on the n-InP substrate so as to form a Bragg lattice on the n-InP substrate.

Figure 4B:
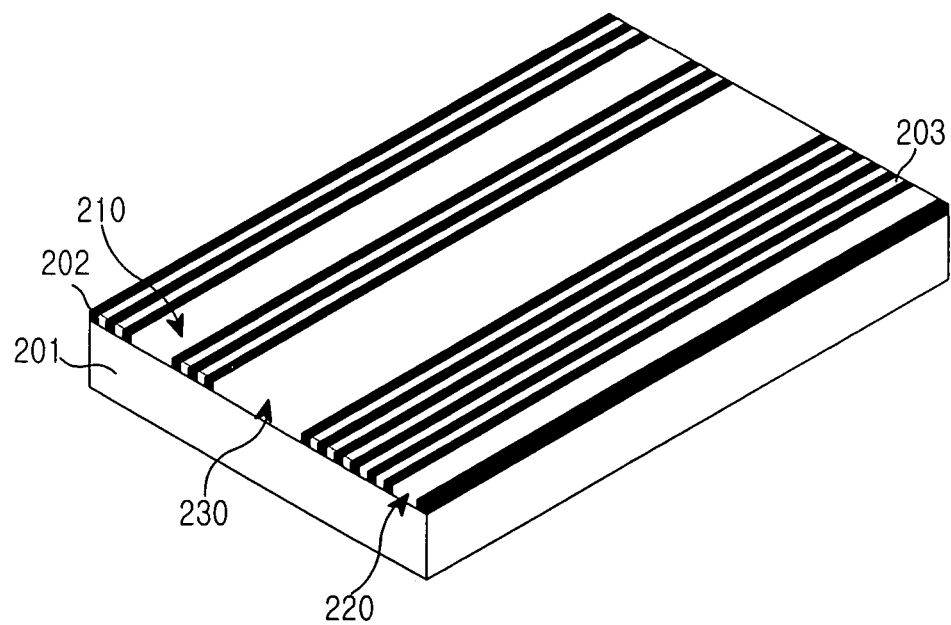

Referring to FIG. 4B, the Bragg lattice layer is formed on the n-InP substrate 201 except for a predetermined gain layer forming area 230, a predetermined photo detector area 220, and the predetermined phase conversion area 210 through a selective etching process. At this time, the Bragg lattice layer 202 may be formed on the n-InP substrate 201 except for the gain layer forming area 230 without forming the phase conversion area 210. The Bragg lattice layer 202 can be formed by a conventional method used for a general wavelength feedback laser.

Figure 4C:
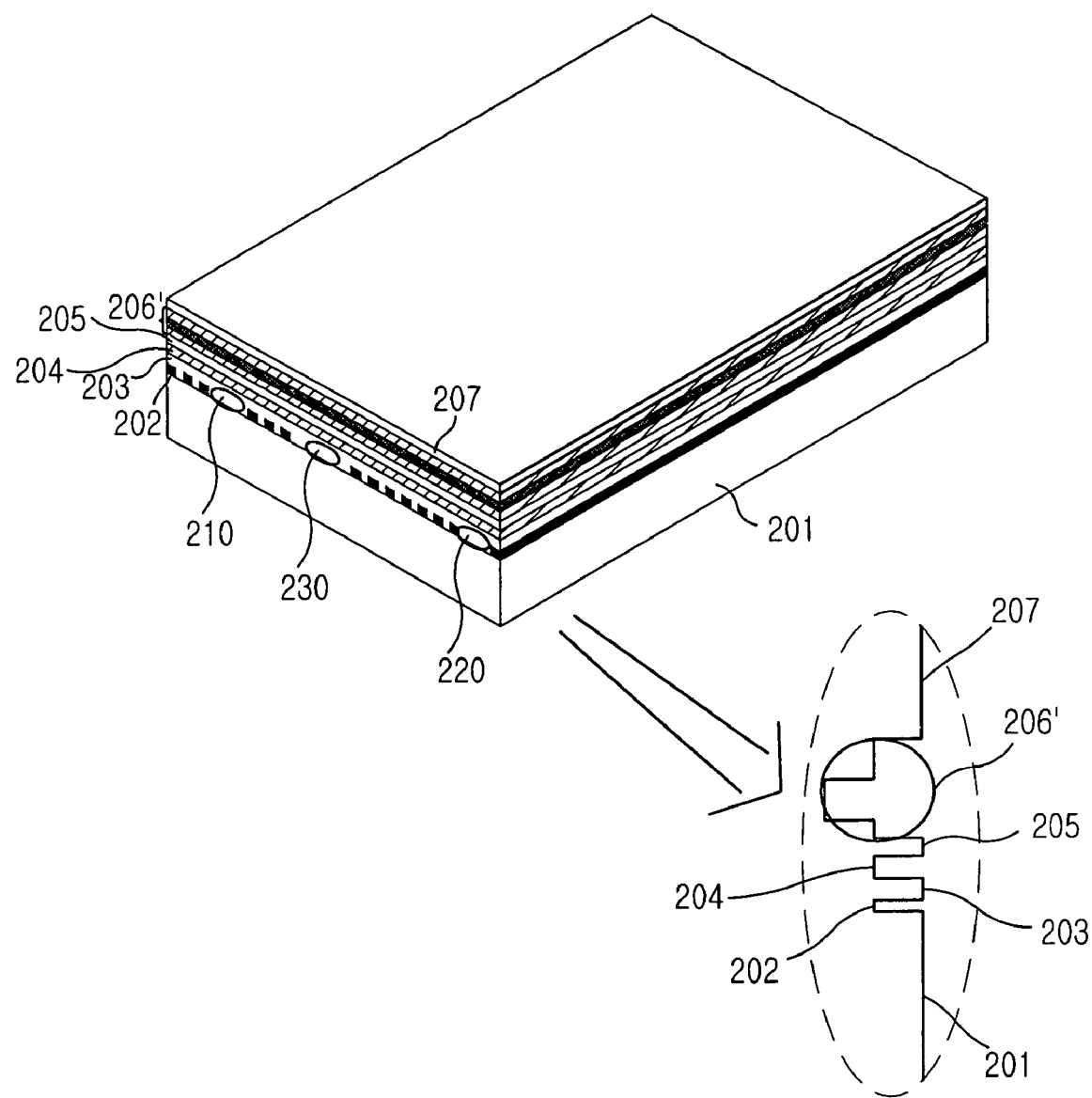

Referring to FIG. 4C, the n-InP lower clad layer 203, the passive optical waveguide layer 204, the n-InP upper clad layer 205, a gain material layer 206' and the p-InP clad layer 207 are sequentially grown on the Bragg lattice layer 202. The gain material layer 206' is grown as a bulk or a quantum well structure. An amplification band of the gain material layer 206' can be controlled by changing a composition ratio of the material forming the gain layer or by changing a thickness of the gain layer according to a wavelength of an inputted optical signal. In FIG. 4C, a step-shape graph shown in a dotted circle represents band-gaps of the passive optical waveguide layer 204 to the p-InP clad layer 207. Although the Bragg lattice layer 202 can be formed above or below the passive optical waveguide layer 204, the present embodiment focuses on the case in which the Bragg lattice layer 202 is formed below the passive optical waveguide layer. Also, although not shown, it is possible, by an additional process, to form an etching stop layer to create a ridge-type waveguide.

Figure 4D:
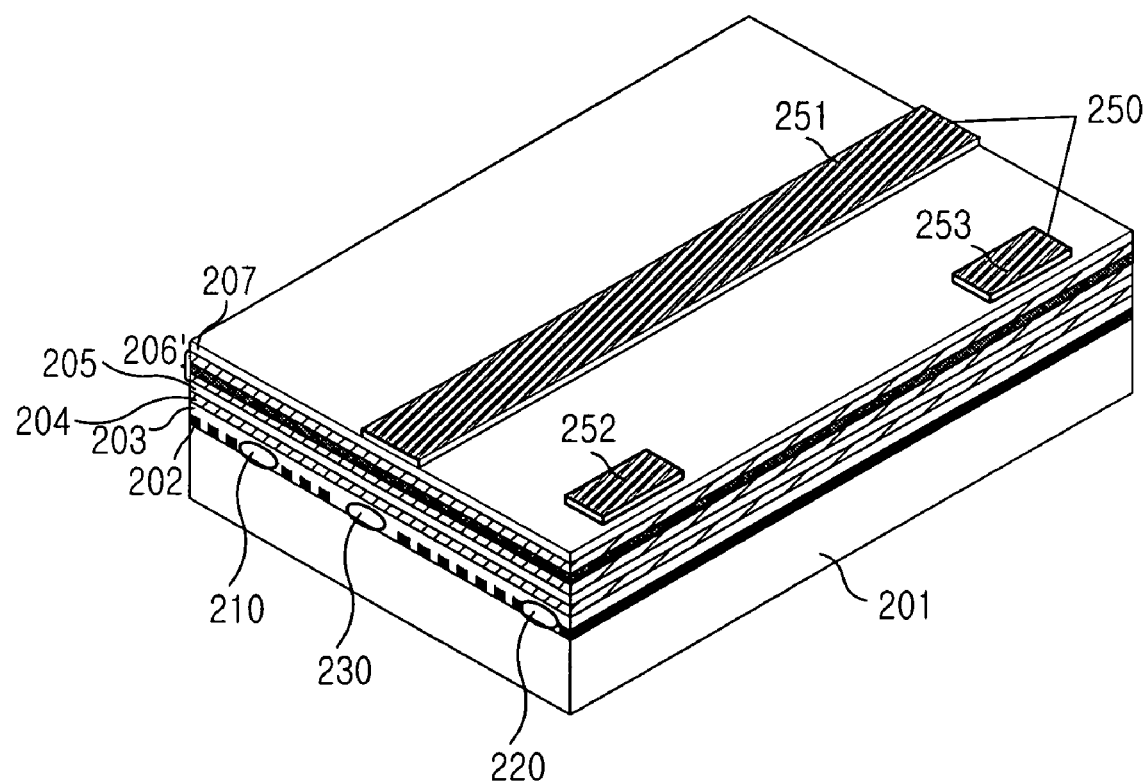

Referring to FIG. 4D, a mask pattern 250 including $SiO_2$, $SiN_2$, etc. is formed on the p-InP clad layer 207. The mask pattern 250 includes a gain-layer mask pattern 251 and active-layer-forming mask patterns 252, 253, the gain-layer mask pattern being formed on the gain layer forming area, and the active-layer-forming mask patterns being formed both at front end and rear end of the gain layer, while being spaced by a predetermined distance horizontally from the gain-layer mask pattern.

Figure 4E:
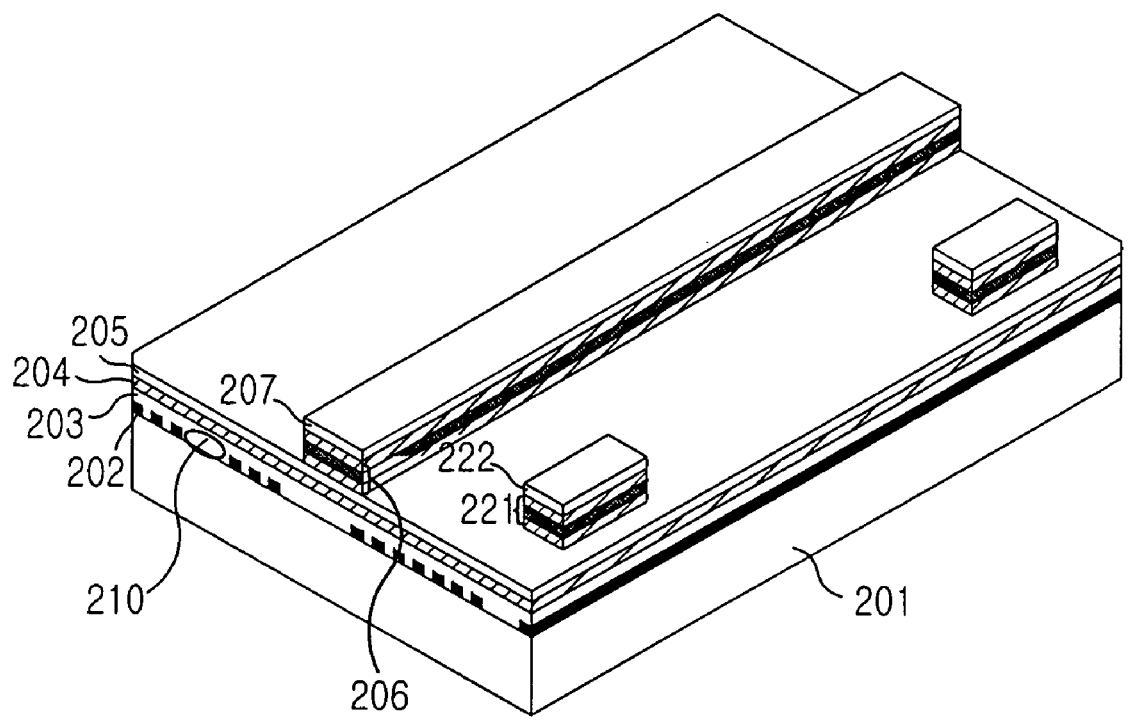

Referring to FIG. 4E, the gain material layer 206' is selectively etched through an etching process using the mask pattern 250 as an etching mask, thereby forming the gain layer 206 and the optical-detector active layer 221, and then the mask pattern 250 is removed.

Figure 4F:
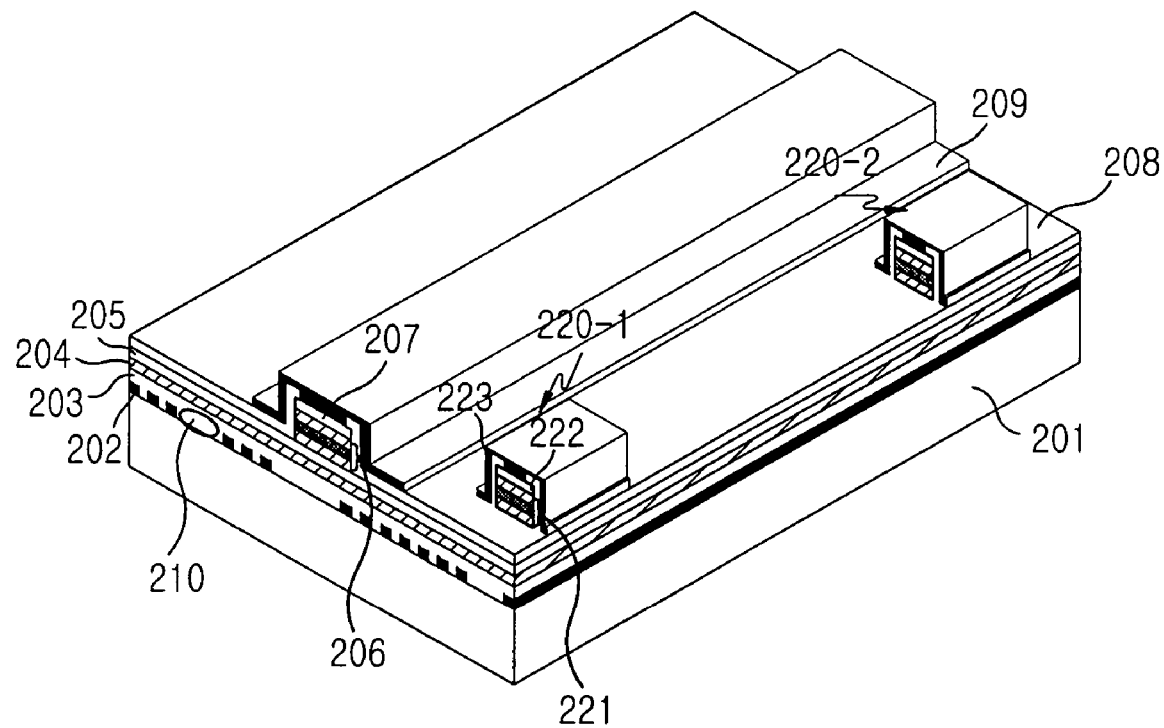

Referring to FIG. 4F, after $SiO_2$ or $SiN_X$ 208 is deposited on a resultant structure which has undergone the selective etching process, a photo mask process and an etching process are performed to expose a gain area into which current is injected. After that, the electrodes 209, 223 are formed. Also, an electrode is formed at a lower surface of the n-InP substrate 201 (not shown). Through the above-mentioned processes, a current blocking layer 208 is formed on an area except for the gain layer 206 and the optical-detector active layer 221.

Figure 4G:
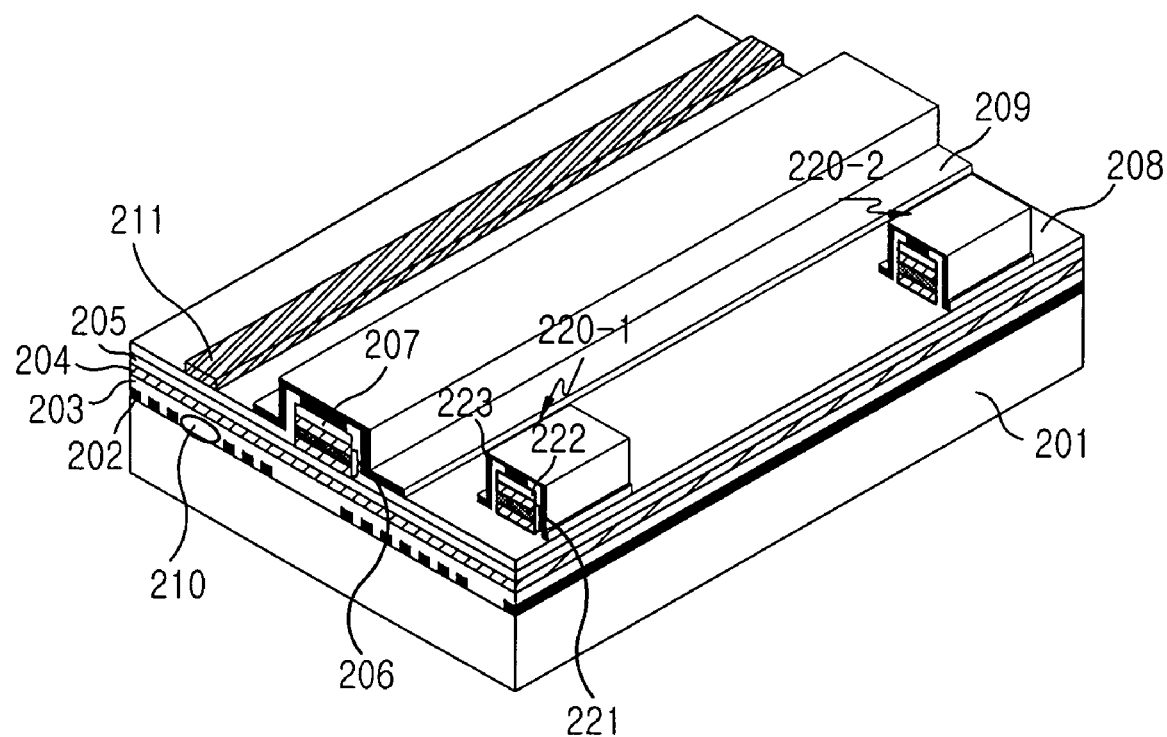

Referring to FIG. 4G, a phase conversion electrode 211 is formed on a portion of the current blocking layer 208 that corresponds to the phase conversion area 210.

The SOA having a photo detector according to the present invention can be realized as a buried hetero-structure besides the ridge waveguide-type gain-clamped SOA shown in FIG. 2.

Figure 5:
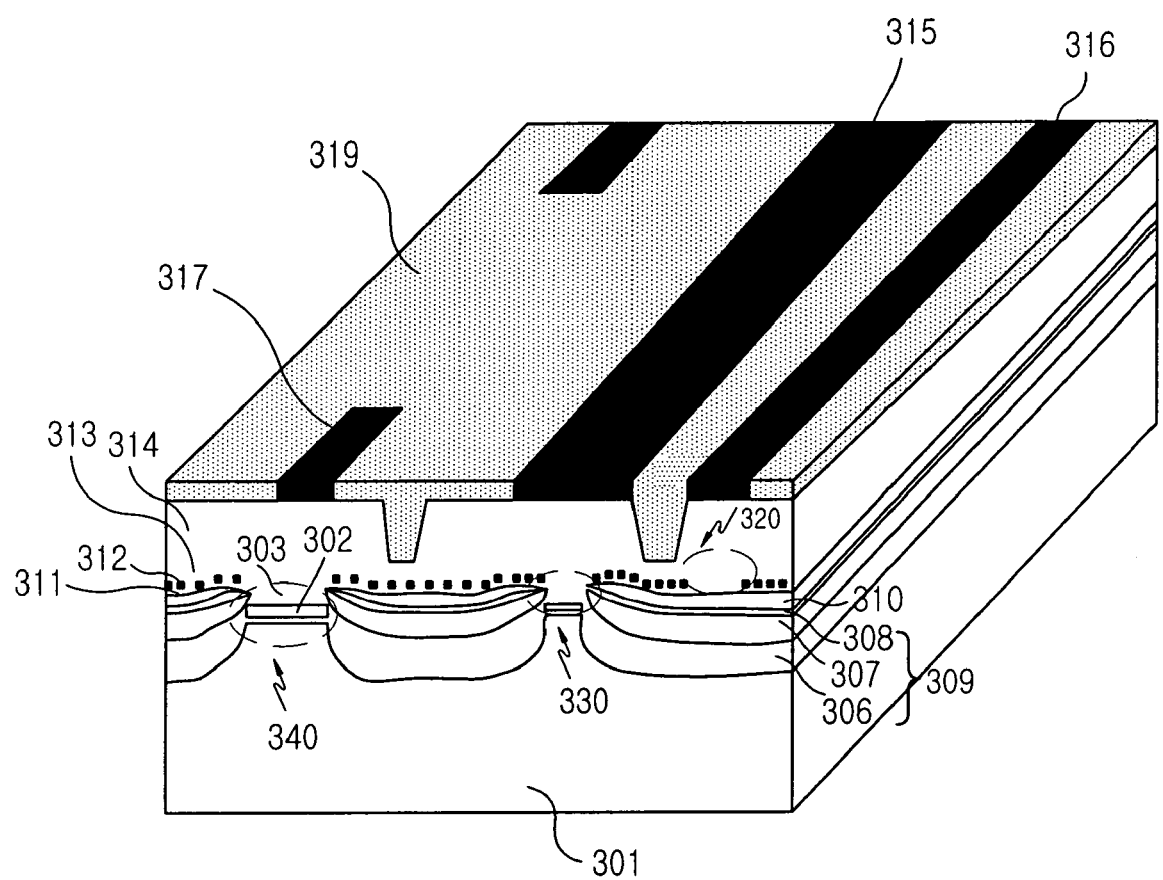
FIG. 5 is a view showing a construction of a SOA having photo detectors according to another embodiment of the present invention.

FIG. 5 is a view showing a possible construction of a gain-clamped SOA 300 having a buried hetero-structure including a photo detector according to another embodiment of the present invention. The gain-clamped SOA 300 includes a semiconductor substrate 301, a gain layer 302, a p-InP lower clad layer 303, a current blocking layer 309, an optical waveguide layer 310, a Bragg lattice layer 312, a p-InP upper clad layer 314, an electrode 315, a photo detector area 340, a photo detector electrode 317, and an insulating layer 319. In addition, the gain-clamped SOA 300 includes a phase conversion area 320 and a phase conversion electrode 316 formed above the phase conversion area 320.

The operation of the gain-clamped SOA 300 having a horizontal lasing construction of a buried hetero-structure is similar to the operation of the ridge waveguide-type gain-clamped SOA 200 shown in FIG. 2. Accordingly, a detailed description is omitted.

FIGS. 6A to 6E are views for explaining a preferred fabricating process of the buried hetero-structure gain-clamped SOA 300 shown in FIG. 5.

Figure 6A:
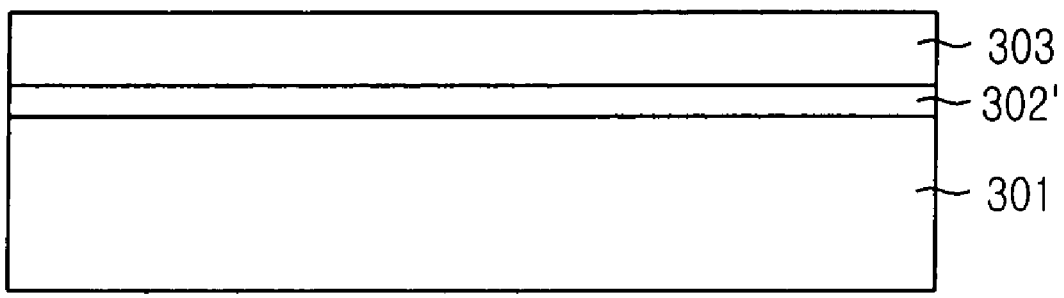
FIGS. 6A to 6E are views for explaining a fabricating process of the SOA having photo detectors shown in FIG. 5.

First, as shown in FIG. 6A, a gain material layer 302' and the p-InP lower clad layer 303 are grown on the n-InP substrate 301.

Figure 6B:
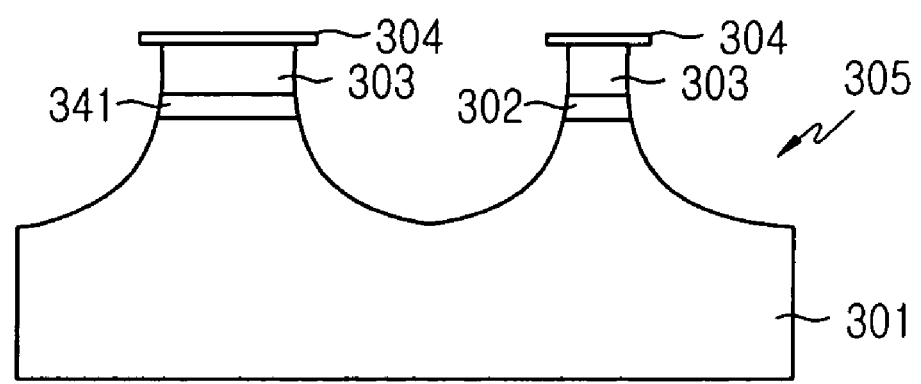

Referring to FIG. 6B, a mask pattern 304 is formed on portions of the p-InP lower clad layer 303 corresponding to a predetermined gain layer area 330 and a predetermined photo detector area 340, through an etching process using an $SiO_2$ or an $SiN_X$ mask. Next, the p-InP lower clad layer 303, the gain material layer 302', and the n-InP substrate 301 are selectively removed through an etching process using the mask pattern 304 as an etching mask, so that the gain layer 302 having a mesa structure, an optical-detector active layer 341, and an etching groove 305 are formed.

Figure 6C:
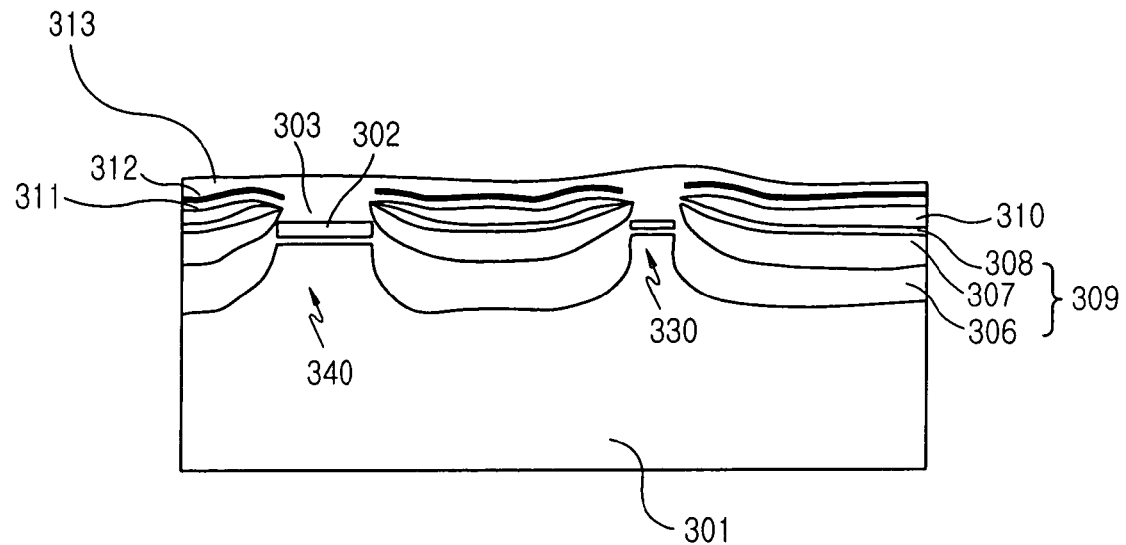

Referring to FIG. 6C, the current blocking layer 309 including a p-InP layer 306, an n-InP layer 307, and a p-InP layer 308 is formed at the etching groove 305. Subsequently, the optical waveguide layer 310 including a material having a higher refractive index than that of the n-InP substrate 301 is formed on the current blocking layer 309. At that time, it is preferred that a gap between the gain layer 302 and the optical waveguide layer 310 be limited to within 2 µm for an optical coupling of a mode between the gain layer 302 and the optical waveguide layer 310. Subsequently, in order to form lattice on the area of the optical waveguide layer area, a thin p-InP clad layer 311, a material layer 312 having a high refractive index and forming a lattice, and a p-InP clad layer 313 are grown.

Figure 6D:
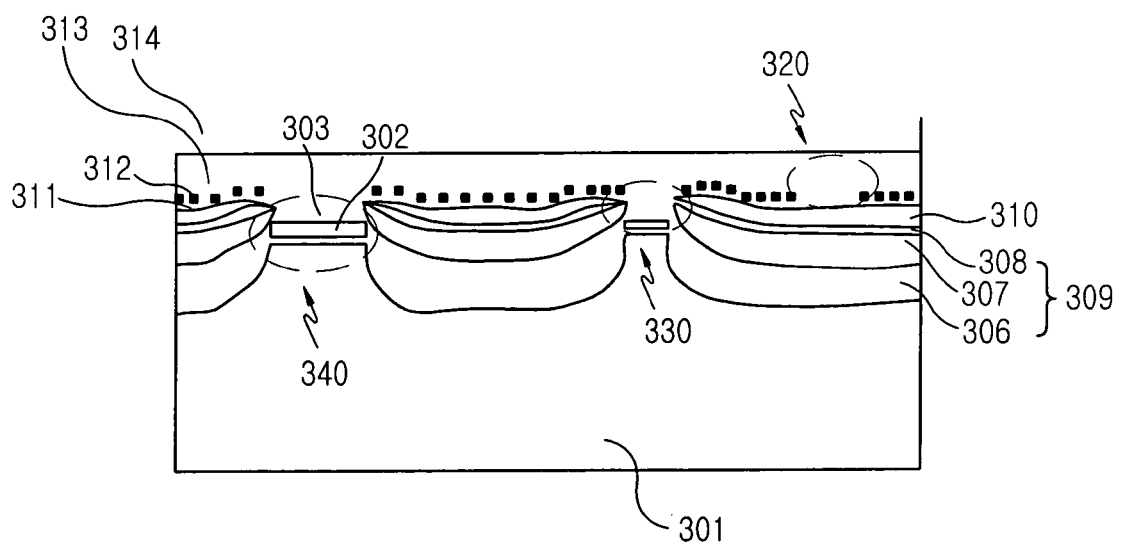

Referring to FIG. 6D, after the Bragg lattice layer 312 is formed on the optical waveguide layer 310 except for the phase conversion area 320, a p-InP upper clad layer 314 is formed thereon. As with the previous embodiment, the Bragg lattice layer 312 can be formed above or below the optical waveguide layer 310. The present embodiment focuses on a case in which the Bragg lattice layer 312 is formed above the optical waveguide layer 310. Also, the phase conversion area 320 may be formed or not according to necessity. A method of forming the Bragg lattice 320 is identical to a conventional method used for a general wavelength feedback laser.

Figure 6E:
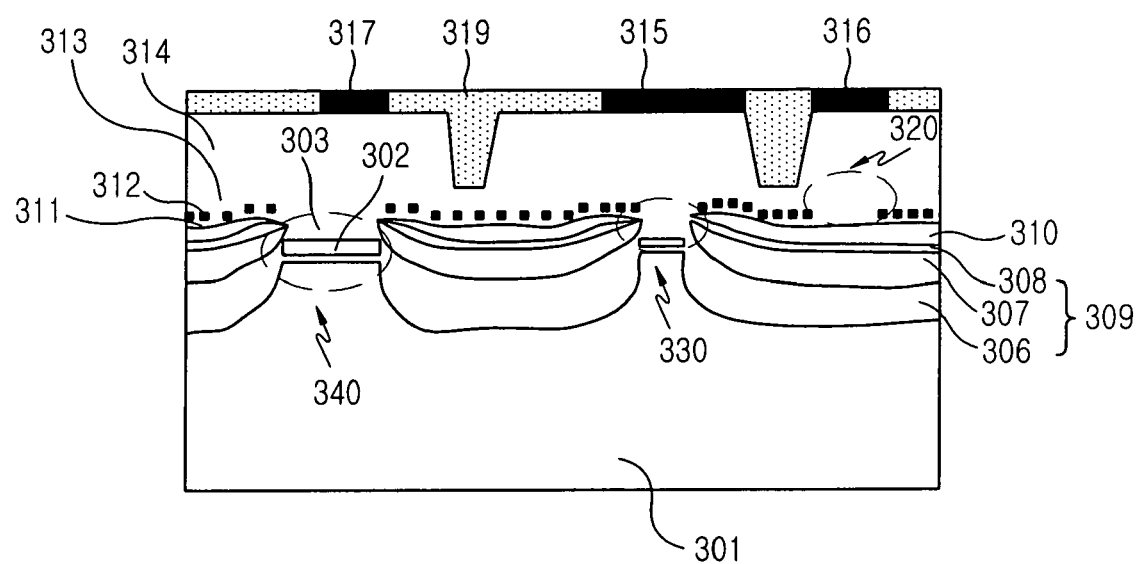

Referring to FIG. 6E, a p-InP upper clad layer 314 is formed on an entire upper surface of a resultant structure, and an $SiO_2$ or an $SiN_X$ insulating layer 319 is deposited on the p-InP upper clad layer 314. Then, after a photo mask process and an etching process are performed to expose an area to which current is injected, electrodes 315, 316, 317 are separately formed. The electrode 315 supplies current into the gain layer, phase conversion electrode 316 supplies current into the phase conversion area 320, and electrode 317 supplies current into the optical-detector active layer. After the electrodes 315, 316, 317 have been formed, the p-InP upper clad layer 314 is etched to separate the optical amplification area 330, the photo detector area 340, and the phase conversion area 320 from each other.

As described above, according to the present invention, since a SOA and photo detectors are integrated on one single crystal substrate, it is possible to detect intensity of signals at an input terminal and an output terminal of the optical amplifier without using a separate optical divider. Therefore, optical loss that would otherwise result from use of the optical divider is avoided, so that the gain characteristic of the optical amplifier is improved.

Also, according to the method of fabricating a SOA having photo detectors, a SOA and photo detectors can be integrated onto a single crystal semiconductor substrate without performing a separate photo detector growing process. This is accomplished by leaving the gain material layer at a position spaced horizontally from a gain layer when an etching process for forming the gain layer of the SOA is performed. Accordingly, when an optical amplifier module is manufactured, the number of components is reduced and the processes are simplified, so that a low-priced optical amplifier can be manufactured.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor optical device comprising of:
   a first conductive semiconductor substrate;
   a semiconductor optical amplifier disposed on the semiconductor substrate having a horizontal-direction lasing structure for generating a laser oscillation in a horizontal direction and amplifying a light input to the semiconductor optical amplifier in a length direction, wherein the length direction is in a non-parallel relationship with the horizontal direction; and
   a first and a second photo detector disposed respectively at positions of the semiconductor substrate spaced horizontally from an input side and an output side of the semiconductor optical amplifier so as to measure intensities of an input signal and an output signal of the semiconductor optical amplifier.

2. The semiconductor optical device as claimed in claim 1, wherein the semiconductor optical amplifier includes a ridge waveguide-type semiconductor optical amplifier.

3. The semiconductor optical device as claimed in claim 1, wherein the semiconductor optical amplifier includes a buried hetero-structure semiconductor optical amplifier.

4. The semiconductor optical device as claimed in claim 1, wherein the lasing horizontal-direction is perpendicular to the signal amplification direction.

5. The semiconductor optical device as claimed in claim 1, wherein the semiconductor optical amplifier configured to amplify an input signal without a wavelength filter for removing an oscillation wavelength generated by the semiconductor optical amplifier.

6. The semiconductor optical device as claimed in claim 1, wherein the first and second photo detectors are configured to measure the intensities of the input signal and the output signals of the semiconductor optical amplifier without an optical divider.

7. The semiconductor optical device of claim 2, further including a current blocking layer that comprises two p-inP layers and an n-InP layer.

8. The semiconductor optical device as claimed in claim 2, wherein the semiconductor optical amplifier comprises:
- a Bragg lattice disposed selectively on a portion of the semiconductor substrate except for a predetermined gain layer area;
- a first conductive lower clad layer disposed on and co-extensively with an upper surface of the semiconductor substrate so as to surround the Bragg lattice;
- an optical waveguide layer disposed on the lower clad layer;
- a first conductive upper clad layer disposed on the optical waveguide layer;
- a gain layer disposed on a portion of the first conductive upper clad layer that corresponds to the predetermined gain layer area in order to amplify an optical signal;
- a first electrode for supplying current to the gain layer; and
- a current blocking layer for preventing current from flowing to any area except the gain layer.

9. The semiconductor optical device of claim 3, further including a current blocking layer.

10. The semiconductor optical device as claimed in claim 8, wherein the first and the second photo detectors are respectively disposed on portions of the first conductive upper clad layer horizontally spaced from an input side and an output side of the semiconductor optical amplifier.

11. The semiconductor optical device as claimed in claim 8, wherein each of the first and the second photo detectors comprises:
- an active layer including a material that is the same as that of the gain layer;
- a second conductive clad layer disposed on the active layer; and
- a second electrode disposed on the second conductive clad layer.

12. The semiconductor optical device as claimed in claim 8, further comprising a phase conversion area disposed between lattices of the Bragg lattice.

13. The semiconductor optical device as claimed in claim 8, wherein the semiconductor optical amplifier further comprises a passive optical waveguide layer.

14. The semiconductor optical device as claimed in claim 8, wherein the first and second photo detectors comprise same materials as those of the gain layer.

15. The semiconductor optical device as claimed in claim 10, wherein each of the first and the second photo detectors comprises:
- an active layer including a material that is the same as that of the gain layer;
- a second conductive clad layer disposed on the active layer; and
- a second electrode disposed on the second conductive clad layer.

16. The semiconductor optical device as claimed in claim 11, wherein the optical waveguide layer is disposed above or below the Bragg lattice.

17. The semiconductor optical device as claimed in claim 12, further comprising a phase conversion electrode for supplying current to the phase conversion area.

18. The semiconductor optical device as claimed in claim 13, wherein the passive optical waveguide layer has a refractive index grater than that of the semiconductor substrate.

19. The semiconductor optical device as claimed in claim 13, wherein the passive optical waveguide layer is configured to provide an optical confinement between the Bragg lattice and the gain layer.

20. The semiconductor optical device as claimed in claim 17, wherein the phase conversion electrode is configured to control the lasing wavelength.

21. The semiconductor optical device as claimed in claim 17, wherein the phase conversion electrode is disposed on a portion of the current blocking layer that corresponds to the phase conversion area.

22. The semiconductor optical device as claimed in claim 17, wherein the phase conversion electrode is configured to provide a changing current to the phase conversion area.

* * * * *